(12) United States Patent
Roy (10) Patent No.: US 6,466,504 B1
(45) Date of Patent: Oct. 15, 2002

(54) COMPILABLE BLOCK CLEAR MECHANISM ON PER I/O BASIS FOR HIGH-SPEED MEMORY

(75) Inventor: Richard S. Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/590,619

(22) Filed: Jun. 8, 2000

(51) Int. Cl.[7] ................................................. G11C 7/00
(52) U.S. Cl. ............. 365/218; 365/230.01; 365/230.03; 365/230.06; 365/185.29
(58) Field of Search ............................. 365/218, 230.01, 365/230.03, 230.06

(56) References Cited

U.S. PATENT DOCUMENTS

| | | | |
|---|---|---|---|
| 4,780,847 A | | 10/1988 | Ito ............................. 365/154 |
| 4,928,266 A | | 5/1990 | Abbott et al. ................ 365/189 |
| 5,257,229 A | * | 10/1993 | McClure et al. ............. 365/200 |
| 5,337,273 A | * | 8/1994 | McClure ...................... 365/168 |
| 5,404,331 A | * | 4/1995 | McClure ...................... 365/200 |
| 5,455,798 A | * | 10/1995 | McClure ...................... 365/200 |
| 5,471,426 A | * | 11/1995 | McClure ...................... 365/200 |
| 5,491,444 A | * | 2/1996 | McClure ...................... 327/525 |
| 5,627,787 A | * | 5/1997 | McClure ...................... 365/201 |
| 5,818,758 A | * | 10/1998 | Wojciechowski ...... 365/185.18 |
| 5,896,340 A | * | 4/1999 | Wong et al. ........... 365/230.03 |

* cited by examiner

Primary Examiner—Viet Q. Nguyen
(74) Attorney, Agent, or Firm—Danamraj & Youst, P.C.

(57) ABSTRACT

A circuit for selectively erasing a semiconductor memory instance on a per I/O basis. The circuit is provided as a tilable architectural element in a memory compiler for the semiconductor memory instance. A plurality of pass gates are disposed between global wordlines provided by the row decoder of the memory array and local wordlines that select memory bit cells in a particular I/O. One or more memory clear signals are used to decouple the local wordlines from the global wordlines and to connect them to a high voltage node, $V_{DD}$. The I/O is cleared by placing a predetermined logic state (typically 0) on the bitline nodes of the I/O and selectively coupling the local wordlines to the $V_{DD}$ node.

18 Claims, 6 Drawing Sheets

COMPILABLE BLOCK CLEAR MECHANISM ON PER I/O BASIS FOR HIGH-SPEED MEMORY

BACKGROUND OF THE INVENTION

1. Technical Field of the Invention

The present invention relates generally to semiconductor memories, and more particularly, to memory compilers for semiconductor memories having a block erase circuit that is used for clearing the memory array on a per I/O basis or any portion thereof.

2. Description of Related Art

For certain types of memories such as Cache Tags or Translation Lookaside Buffers (TLBs), it is highly desirable to be able to clear the array as quickly as possible, for example, during a context switch. Typically, these types of memories are relatively small compared to the cache memories they are associated with. For a chip that uses compilable memory (e.g., compilable static random access memory or SRAM) for its caches, it would be advantageous to be able to reset the memory (i.e., change the data state for all bits to a "0") on a "per I/O" basis, so that the Tags can be integrated in the same structure as the caches, sharing row decoders and other front end circuitry.

Several methods are known for block clear or reset of a memory. For example, in U.S. Pat. No. 4,780,847 to Ito, a method is disclosed for clearing a standard 6T SRAM cell by raising one of the $V_{SS}$ terminals in the cells to the $V_{DD}$ during the block clear operation. However, this method is applicable only to a 6T SRAM cell, with the further requirement that multiple $V_{SS}$ signals be supplied to each memory bit cell (typically with vertical metal lines parallel to the bitlines). Clearly, such limitations are disadvantageous for the high-speed, high density memory processes using 0.18 µm or smaller geometries that are currently being employed, since the $V_{SS}$ line is often run in the middle of the cell rather than shared between adjacent cells as in typical topologies of previous generations.

Another technique for clearing a memory is disclosed in U.S. Pat. No. 4,928,266 to Abbott et al., wherein one or more "reset" transistors are added to the memory bit cell itself in order to force the memory bit cell to a known state with an active signal supplied to the additional transistors. This is typically done by converting one (or both for symmetry reasons) of the cross-coupled inverters in the memory bit cell to a NOR gate which drives the cell to a known state upon application of the reset signal to the gate of the additional transistor(s). It should be apparent that this method has the obvious disadvantage of adding a significantly greater area to the standard memory bit cell. Further, including a non-standard memory bit cell to obtain erase functionality means that this type of memory bit cell must be qualified from a manufacturability and reliability standpoint in addition to qualifying the normal (i.e., standard) memory bit cells, which entails significant work and additional time-to-market. Finally, in compiled memory architectures where the 1P memory bit cell is vertical and 2P cell is horizontal, the schedule penalty of re-laying out the pitched cells (e.g., X-decoders, Y-muxes, etc.) in both directions is severe for the NOR method.

SUMMARY OF THE INVENTION

Accordingly, the present invention advantageously provides a circuit for selectively erasing a semiconductor memory instance made up of standard memory bit cell topologies on a per I/O basis or any portion of the array, which overcomes these and other shortcomings and deficiencies of the current techniques. Preferably, the circuit is provided as a tilable architectural element in a memory compiler for the semiconductor memory instance. A plurality of pass gates are disposed between global wordlines provided by the row decoder of the memory array and local wordlines that select all memory bit cells accessed by a particular I/O that is provided to be erasable. One or more memory clear signals are used to decouple the local wordlines from the global wordlines and to connect them to a high voltage node, $V_{DD}$, when a clear operation is to be performed. The I/O block is cleared by placing a predetermined logic state (typically 0) on the bitline nodes of the memory bit cells therein and selectively coupling the local wordlines to the $V_{DD}$ node. In other exemplary embodiments, the erasable I/Os of the entire memory array may be successively erased in staggered proportions (e.g., ⅛th, ¼th, ½th, etc.) by utilizing multiple clear signals, each being responsible for clearing a portion of the I/O, so as to spread out and reduce the peak value of the high current spike in the array.

In another aspect, the present invention is directed to a memory compiler for use in designing an integrated semiconductor device having an embedded memory instance that is selectively erasable. Included in the compiler architecture is a memory macro cell associated with the embedded memory instance, wherein the memory macro cell comprises an array core with a row decoder for generating global wordlines. At least one memory array I/O block includes a tilable circuit associated therewith to selectively erase memory bit cells therein. In a further exemplary embodiment, a driver circuit is included to disable a high voltage node (i.e., $V_{DD}$ node) associated with the memory bit cells in the I/O block so that the erase process does not have to contend with the internal electrical characteristics of the cells under an active $V_{DD}$ node.

In yet further aspect, the present invention is directed to a circuit provided as a repeatable architectural element in a memory compiler, wherein the circuit is used for selectively clearing an I/O block in a memory array. The circuit preferably comprises a plurality of pass gates disposed between global wordlines generated by a row decoder provided for the memory array and local wordlines provided selecting memory bit cells in the clearable I/O block. Memory clear logic is provided for selectively decoupling the local wordlines from the global wordlines so as to pull the local wordlines to a high voltage node. Memory bit cells coupled to the local wordlines are erased when a predetermined logic state is applied at bitline nodes of the memory bit cells of the I/O block and the local wordlines are pulled high as set forth above.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
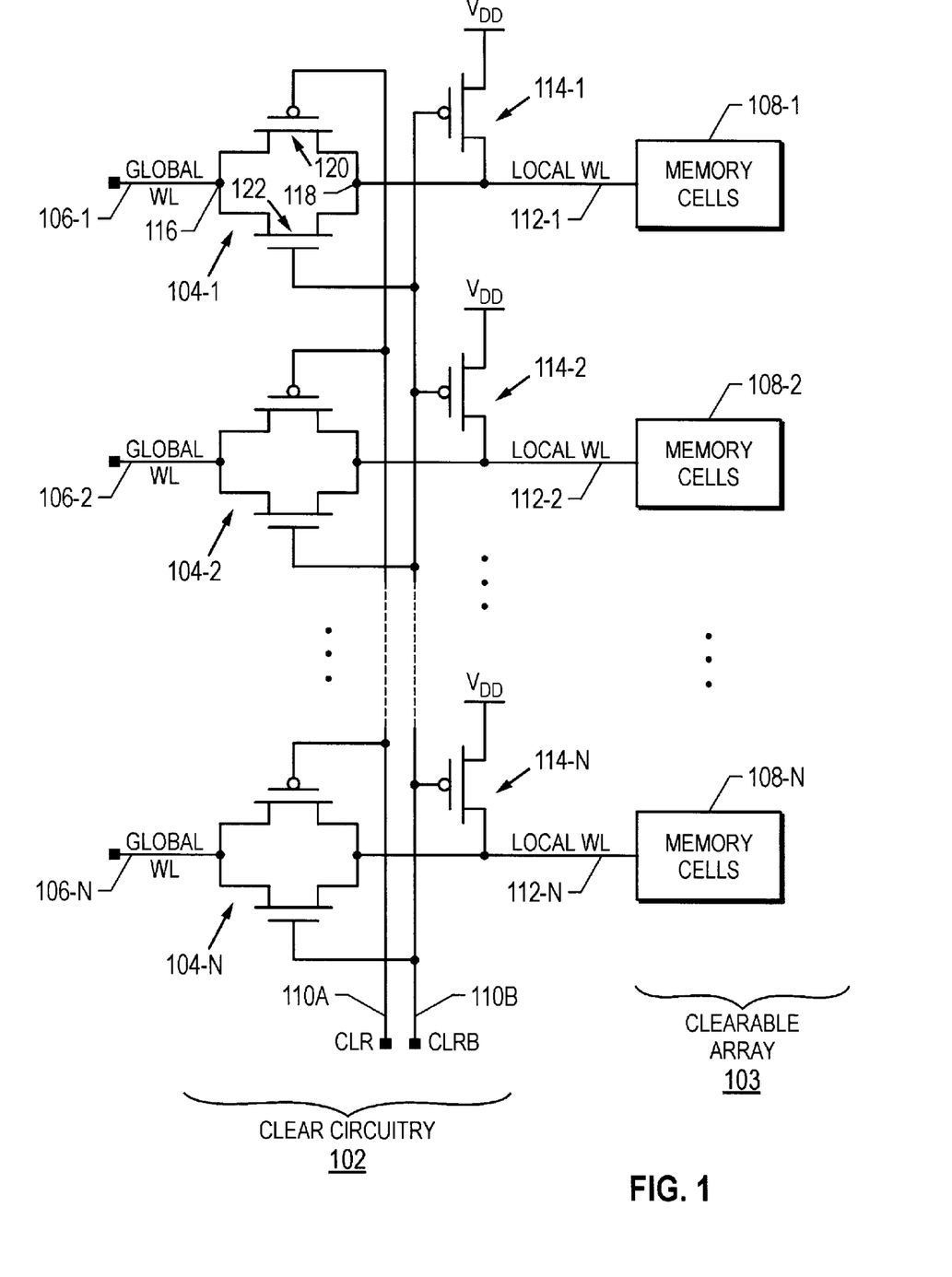
FIG. 1 depicts an exemplary embodiment of a compilable memory clear circuit provided in accordance with the teachings of the present invention for selectively erasing a memory array portion.

In the drawings, like or similar elements are designated with identical reference numerals throughout the several views thereof, and the various elements depicted are not necessarily drawn to scale. Referring now to FIG. 1, depicted therein is an exemplary embodiment of a compilable memory clear circuit 102 provided in accordance with the teachings of the present invention for selectively erasing a memory array portion. It should be understood by those skilled in the art that for purposes of the present invention, terms such as "clear", "erase", or "reset" are utilized interchangeably and synonymously throughout the remainder of the disclosure to indicate writing all zeros into a select portion of the memory array.

A plurality of full CMOS pass gates, reference numerals 104-1 to 104-N, are provided for selectively coupling global wordlines (GWL 106-1 through GWL 106-N) generated by a row decoder (not shown in this FIG.) to local wordlines (LWL 112-1 through LWL 112-N), each of which is coupled to a row of memory bit cells (108-1 through 108-N) in a clearable array 103. All bits in the array 103 are accessed by an individual Input/Output (I/O) "pad," hence the nomenclature "clearable I/O."

In the exemplary embodiment depicted in FIG. 1, memory clear logic is provided by means of a single memory clear signal (CLR) 110A and its complement (CLR_B) 110B which are used to de-activate the pass gates such that a GWL is decoupled from its corresponding LWL. Also, the logic is used for pulling the de-coupled LWLs to a high voltage node, i.e., $V_{DD}$, by means of appropriate pull-up transistors 114-1 through 114-N.

Focusing on the pass gate 104-1 in particular, memory erase functionality of the clear circuitry 102 is described as follows. In normal memory operation, when a logic 0 is present on the CLR signal 110A (i.e, a logic 1 is present on the CLR_B signal 110B), the pass gate 104-1 is enabled because transistors 120 and 122 are turned on by CLR and CLR_B signals, respectively. Accordingly, the GWL node 116 is coupled to the LWL node 118. Also, the pull-up transistor 114-1 coupled between the LWL and $V_{DD}$ is turned off because of the logic 1 state of the CLR_B signal 110B.

When the CLR signal 110A is asserted (i.e., logic 1) for erase operations, the pass gate transistors 120 and 122 are turned off and the pull-up transistor 114-1 is turned on. Accordingly, the LWL 112-1 is pulled high. As those skilled in the art may appreciate upon reference hereto, by applying particular voltage levels at the bitlines of the memory bit cells 108-1 when the LWL is pulled high (i.e., logic 0 at the Bitline True (BT) node and logic 1 at the Bitline Bar (BB) node of the cells, depicted in FIGS. 5A and 5B), a logic 0 is written into the cells.

It should be recognized that a single CLR signal (and its complement) is used in this exemplary embodiment to erase the entire array block 103, as it controls each of the pass gates disposed between the GWLs and the LWLs.

Figure 2:
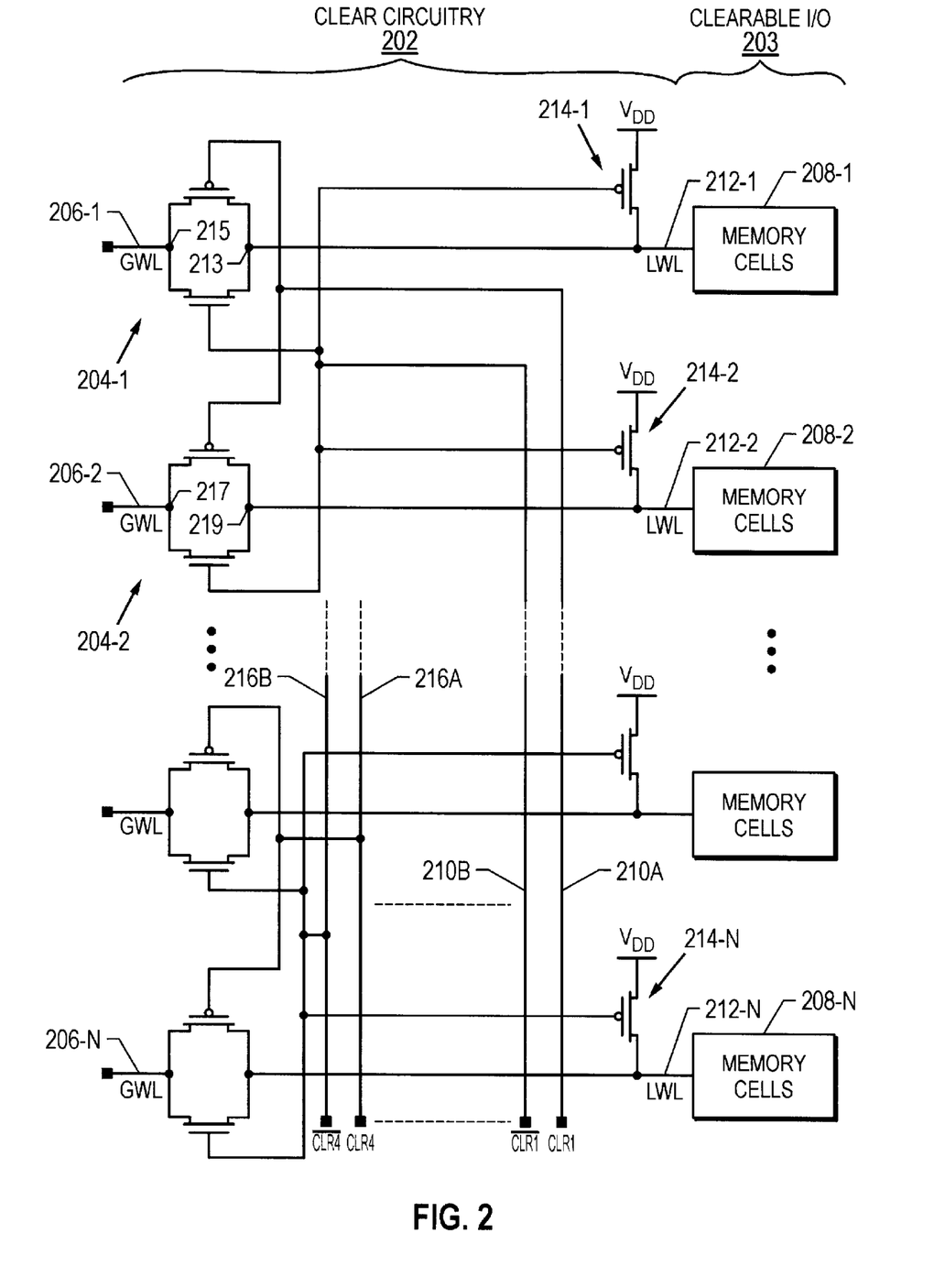
FIG. 2 depicts another exemplary embodiment of a compilable memory clear circuit provided in accordance with the teachings of the present invention for selectively erasing a memory array portion.

FIG. 2 depicts another exemplary embodiment of a compilable memory clear circuit 202 provided in accordance with the teachings of the present invention for selectively erasing a memory array portion. Similar to the embodiment described above, a plurality of GWLs (reference numerals 206-1 through 206-N) and corresponding LWLs (reference numerals 212-1 through 212-N) are coupled via pass gates (reference numerals 204-1 through 204-N) for normal memory operations with respect to the cells (reference numerals 208-1 through 208-N) in the erasable I/O block 203. On the other hand, a plurality of memory clear signals are used in this exemplary embodiment wherein each CLR signal (and its complement) is utilized for erasing a select portion of the erasable I/O block 203. Four CLR signals are exemplified in this implementation, wherein CLR1 210A (and CLR1_B 210B) and CLR4 216A (and CLR1_B 216B) are shown in FIG. 2.

Each CLR signal de-activates a select number of the pass gates and correspondingly turns on a plurality of pull-up transistors so as to effectuate the erase process for a portion of the I/O block 203 as described hereinabove. For example, as depicted in FIG. 2, the erase process for memory bit cell portions 208-1 and 208-2 is controlled by CLR1 210A and CLR1_B 210B signals. In normal memory access operation, CLR1 is logic 0 and CLR1_B is logic 1, thereby coupling GWL 206-1 to LWL 212-1 via nodes 215 and 213 in the pass gate 204-1, and GWL 206-1 to LWL 212-2 via nodes 217 and 219 in the pass gate 204-1. When CLR1 is logic 1 and CLR1_B is logic 0, pass gates 204-1 and 204-2 are disabled. Also, the pull-ups 214-1 and 214-2 are turned on such that LWL 212-1 and LWL 212-2 are driven high. As has been pointed out hereinabove, by placing appropriate logic levels on the bitline nodes under when the LWLs are driven high, 0's are written into the memory bit cell portions 208-1 and 208-2.

In similar fashion, any number of pass gates may be controlled by each CLR signal provided in the clear circuitry 202 for selectively erasing a corresponding portion of the erasable I/O block 203. Those skilled in the art should appreciate that by erasing the I/Os in multiple partitions, high current spikes are advantageously avoided in the memory array so that smaller transient voltage drops are obtained with respect to the erase operation. Further, by incrementing the cumulative amount of memory partitions that get erased in a staggered nonlinear manner, the erase process does not have to contend with the floating/residual voltage levels of the memory bit cell partitions. If minimum bitline write drivers are used, they may not be able to overcome residual "1" levels when the clear operation is attempted on all cells simultaneously. With the staggered clear operation, the first set of cells cleared will augment the subsequent clear operations on the remaining cells attached to each bitline.

Figure 3:
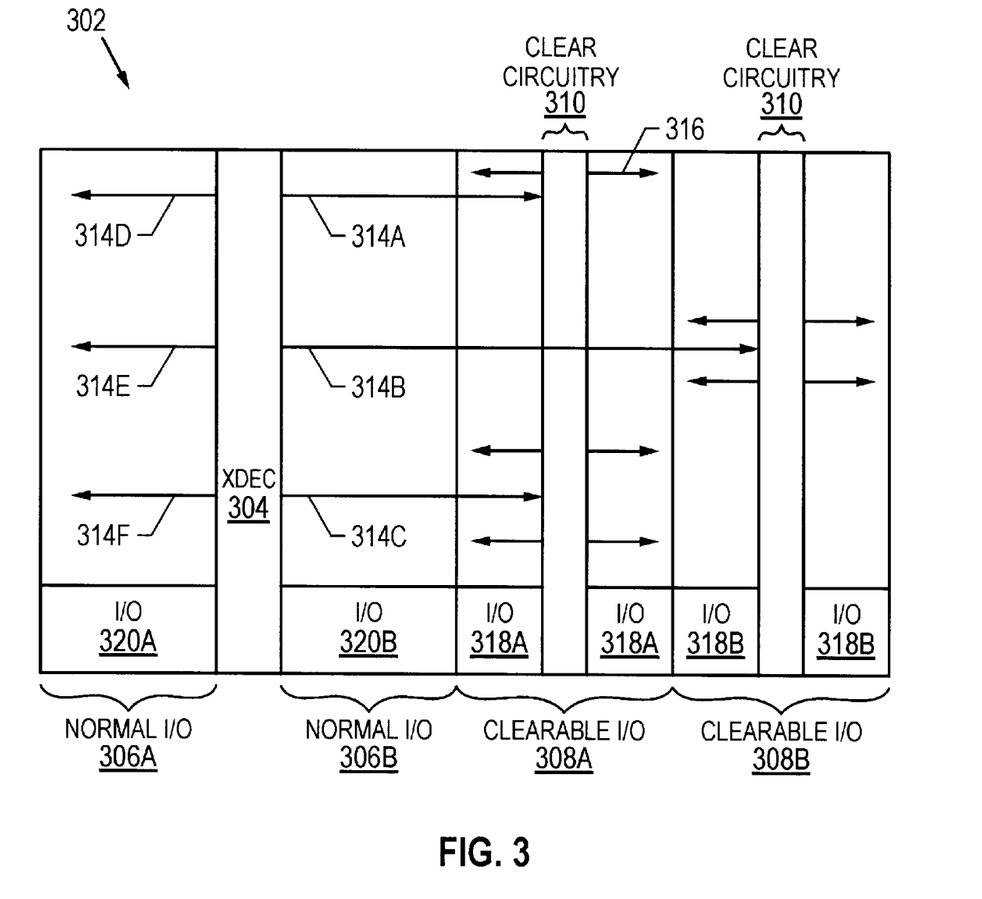
FIG. 3 depicts a physical architectural view of a presently preferred exemplary embodiment of a compilable memory having the memory clear circuit of the present invention for erasing memory bit cells on a per I/O basis.

Referring now to FIG. 3, depicted therein is a physical architectural view of a presently preferred exemplary embodiment of a compilable memory array instance 302 of the present invention for erasing memory bit cells on a per I/O basis. A select number of I/O blocks, for example, two, four, or eight I/O blocks, etc, of the array instance 302 may be provided with the erase capability, which may be interspersed anywhere within the array among the conventional I/O blocks because of the tilable nature of the compiler. That is, each erasable and conventional I/O block is typically provided as a repeatable architectural element for tiling in any array configuration to satisfy customer requirements. In the memory instance 302, reference numerals 308A and 308B exemplify two such erasable or clearable I/O blocks, whereas reference numerals 306A and 306B exemplify conventional (or normal) I/O blocks. Each I/O block is conventionally provided with column mux and sense amp circuitry (collectively I/O circuitry). For illustrative purposes, I/O 320A and 320B are exemplified for the normal I/O blocks. Similarly, I/O 318A or 318B are exemplified for the erasable I/O blocks.

A main wordline decoder (XDEC) 304 is conventionally disposed in the array 302 for generating GWLs (e.g., reference numerals 314A–314F) which are provided to each of the I/O blocks of the circuit. Each clearable I/O block is provided with clear circuitry (referred to as a "clear strip") 310 which preferably comprises one of the circuit embodiments described hereinabove. For the clearable I/O blocks, LWLs (e.g., reference numeral 316) are provided for selecting the local or subword lines within the particular I/O block. In accordance with the teachings of the present invention, such LWLs are selectively coupled to and de-coupled from the GWLs emanating from the XDEC 304. Further, these LWLs are selectively pulled high correspondingly under the control of the clear signal logic provided in the clear strip 310 for facilitating the erase process described hereinabove.

Figure 4A:
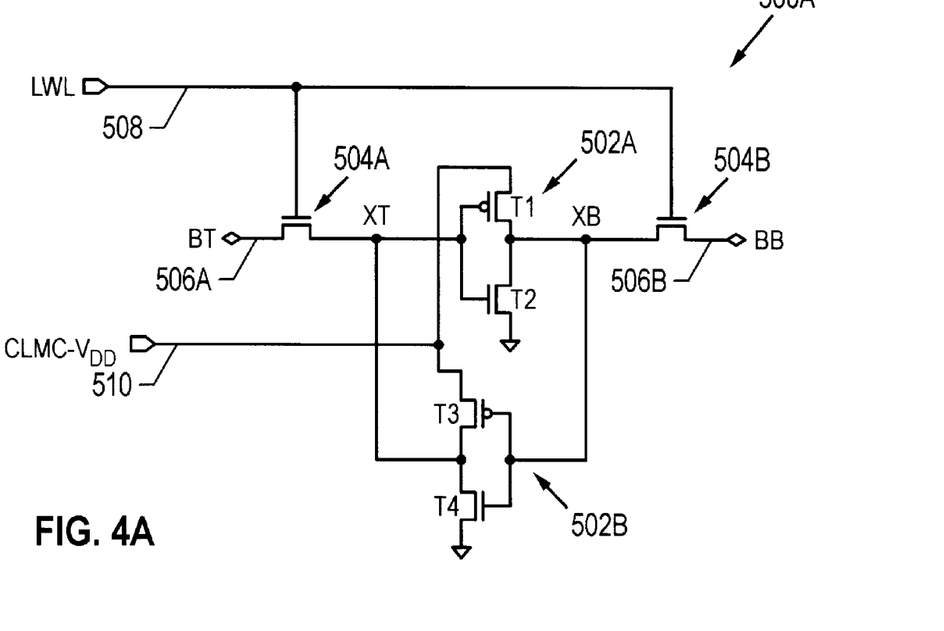
FIGS. 4A and 4B depict two exemplary 6T SRAM cells, with and without disabling $V_{DD}$, respectively, for practicing the teachings of the present invention.
Figure 4B:
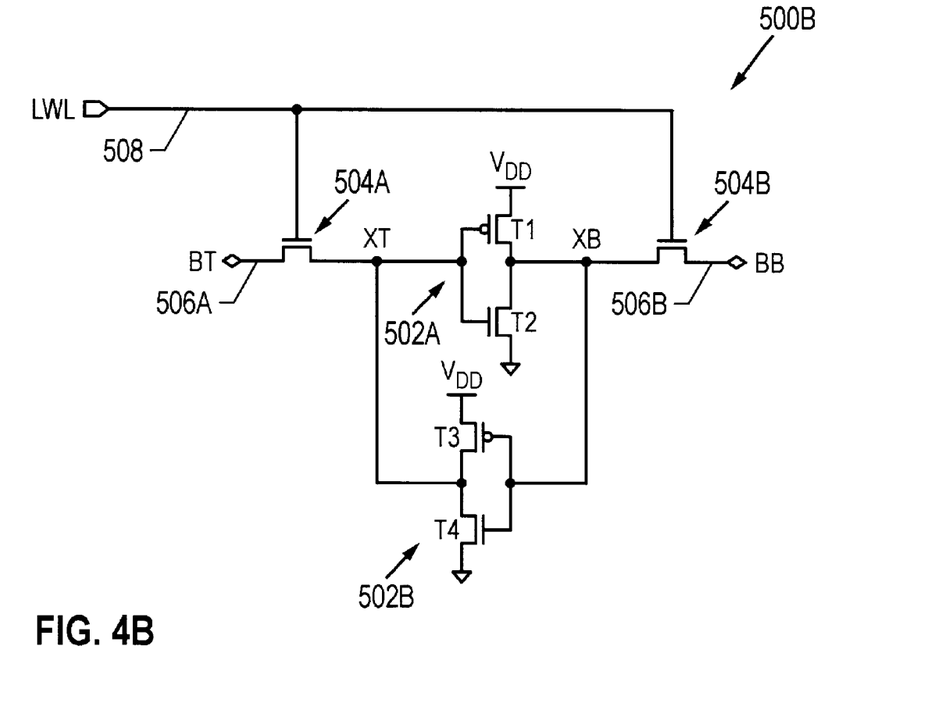

FIGS. 4A and 4B depict two exemplary 6T SRAM cells (reference numerals 500A and 500B) which illustrate the memory bit cells of the erasable I/O blocks of the array instance 302 above. In both embodiments, two cross-coupled CMOS inverters 502A and 502B are conventionally provided between XT and XB nodes of the memory bit cell. Each CMOS inverter has its P-channel transistor (T1 or T3) coupled to $V_{DD}$, the high voltage power supply node of the memory bit cell, and its N-channel transistor (T2 or T4) coupled to $V_{SS}$, the lower voltage supply node (or ground node) of the memory bit cell.

Access control transistors 504A and 504B couple the XT and XB nodes to the BT and BB nodes 506A and 506B, respectively, of the memory bit cell. LWL 508 is coupled to the gates of the access control transistors and, as described hereinabove, a 0 is written into the memory bit cells by setting all bitlines (i.e., BT and BB nodes) to a predetermined state (BT=0 and BB=1) and driving the LWL high. In this manner, the cell is "erased" by means of "bitline writing."

In the memory bit cell embodiment shown in FIG. 4A, the $V_{DD}$ node is provided to be disable-able by means of a disable signal (Clear Memory bit cell-$V_{DD}$ or CLMC-$V_{DD}$) 510 which is generated by means of a switch and the like, preferably provided in a clear strip circuit implementation of the present invention. Those skilled in the art should recognize that by driving the $V_{DD}$ of the memory bit cells low, the erase process of the present invention does not have to contend with the cell current that may be present in the cells due to active $V_{DD}$.

Figure 5A:
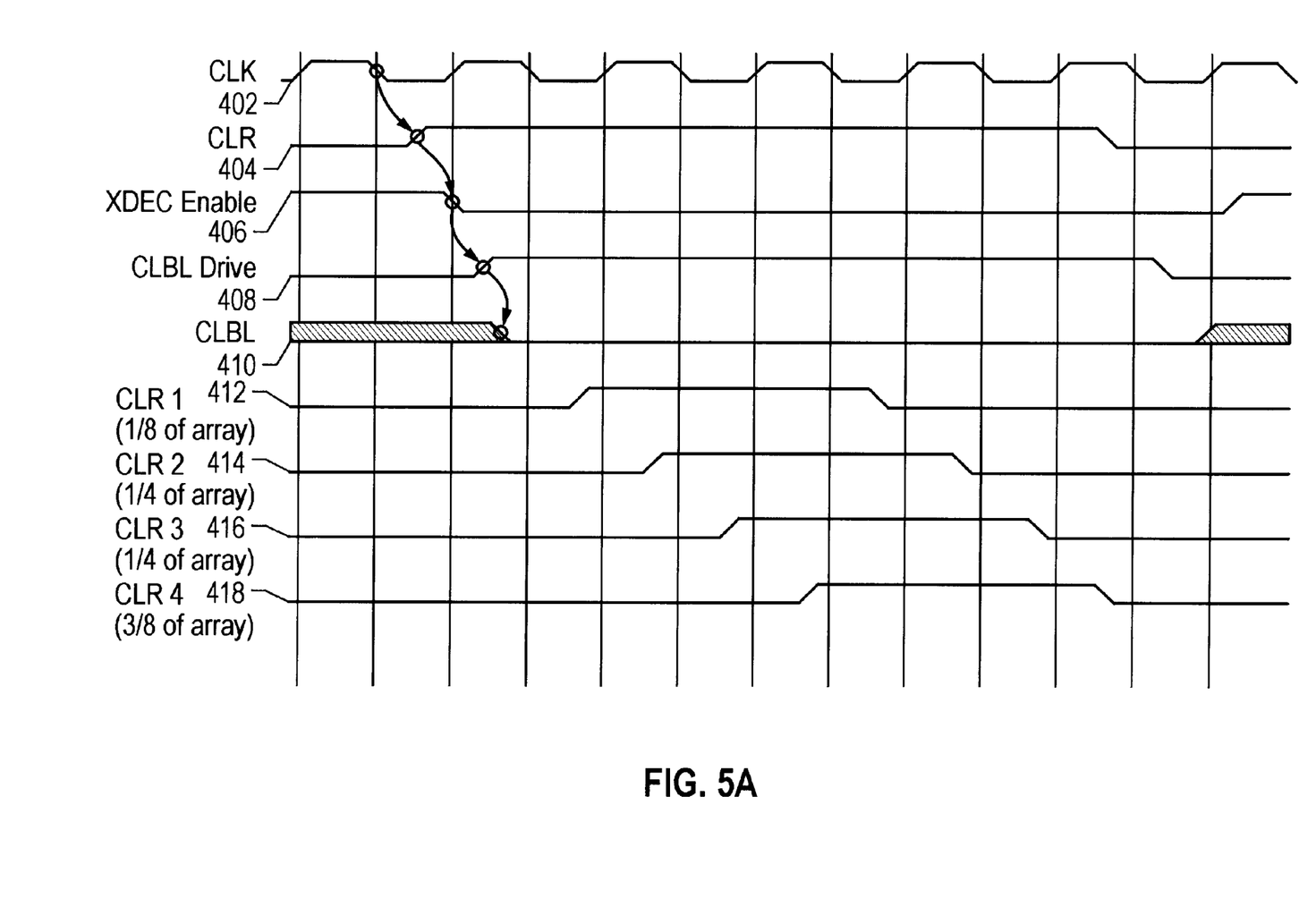
FIG. 5A is a timing diagram which depicts timing relationships among the various signals used in the compilable clear mechanism of the present invention wherein $V_{DD}$ of the memory bit cells is not disabled.
Figure 5B:
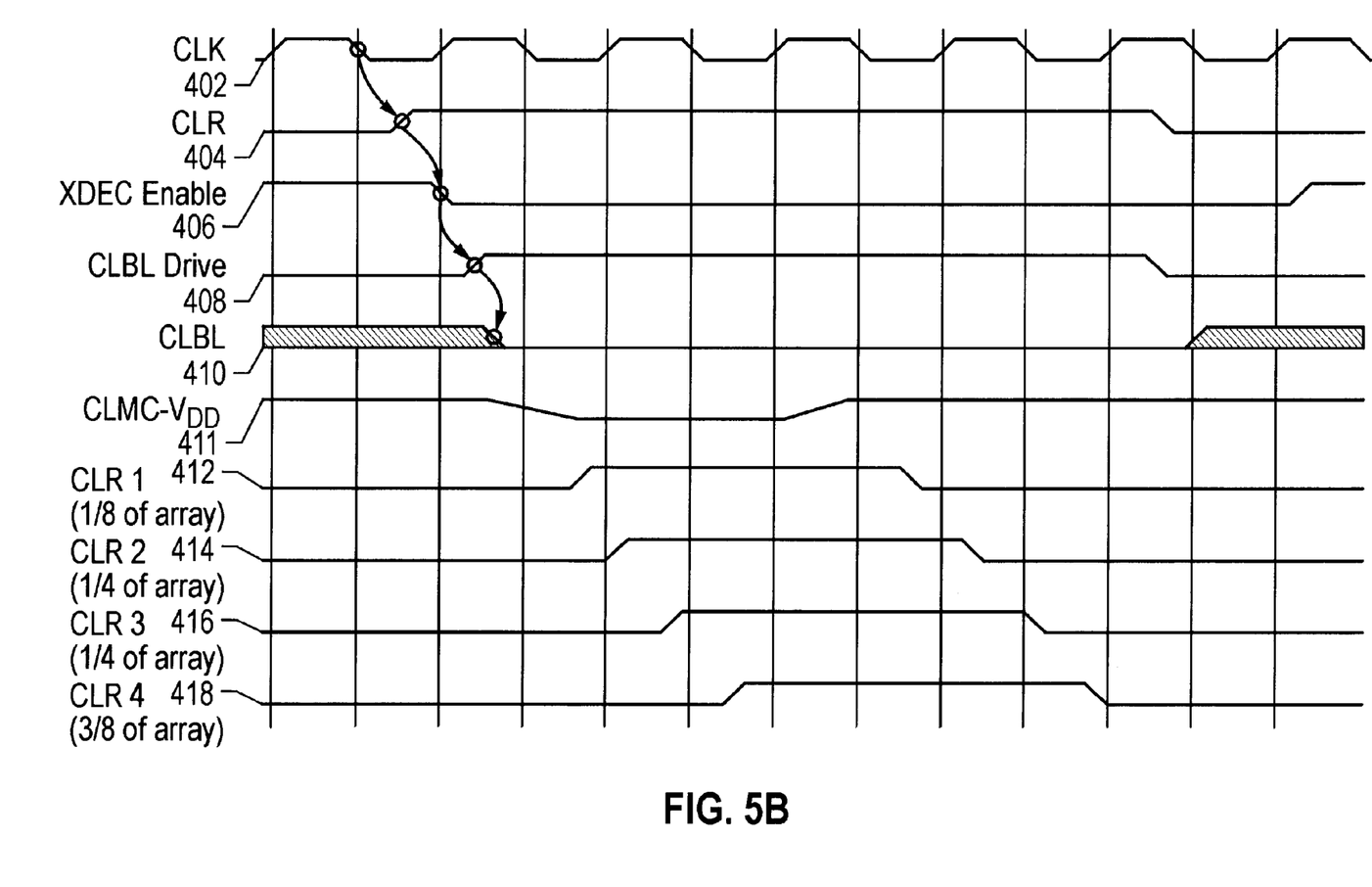
FIG. 5B is a timing diagram which depicts timing relationships among the various signals used in the compilable clear mechanism of the present invention wherein $V_{DD}$ of the memory bit cells is selectively disabled.

FIGS. 5A and 5B depict timing diagrams which exemplify timing relationships among the various signals used in the erase process of the present invention. It should be apparent that the two timing diagrams exemplified herein are essentially similar and illustrative of the compilable clear mechanism based on multiple CLR signal logic, whereas the timing diagram shown in FIG. 5B is particularly directed to the scenario where the $V_{DD}$ node of the erasable cells is disabled by means of a CLMC-$V_{DD}$ signal 411 which is driven low. Accordingly, a common description of the timing diagrams which essentially applies to both non-disabled and disabled $V_{DD}$ scenarios is set forth below.

Based on a clock (CLK) signal 402, a master clear (CLR) signal 404 is asserted in order to initiate the erase process of the present invention. In response thereto, the row decoder enable (XDEC Enable) signal 406 is driven low to disable normal memory access functions. A Clear Bitline Drive (CLBL Drive) signal is driven high thereafter. Subsequently, Clear Bitline (CLBL) signals 410 which are coupled to the BT nodes of the erasable memory bit cells are driven low so that the desired logic is placed on the BT and BB nodes of the cells. Thereafter, a plurality of CLR signals (e.g., reference numerals 412, 414, 416, and 418) are successively taken high so that the I/O block is erased in staggered partitions.

Based on the foregoing, it should be appreciated that the present invention provides an erase scheme that is advantageously provided as a compilable circuit element such that it is user-configurable for addressing different needs. Furthermore, the erase process of the present invention is not dependent upon the cell architecture and does not require any extra structures to be added to the cell itself for providing the reset capability. Thus, the teachings of the present invention may be advantageously practiced with different SRAM and DRAM technologies (such as 1 transistor (1T) and 4 transistor (4T) memory cell topologies).

Additionally, it is believed that the operation and construction of the present invention will be apparent from the foregoing Detailed Description. While the process and circuitry shown and described have been characterized as being preferred, it should be readily understood that various changes and modifications could be made therein without departing from the scope of the present invention as set forth in the following claims.

What is claimed is:

1. A circuit for selectively erasing a portion of a memory array, comprising:

a plurality of pass gates, each of which is disposed between a global wordline emanating from a row decoder provided for said memory array and a local wordline coupled to a memory array portion; and a logic portion for alternatively coupling said local wordline to one of said global wordline and a high voltage node, said logic portion operating at least in part by actuating one of said plurality of pass gates corresponding to said global wordline, wherein said memory array portion is cleared by placing a predetermined logic on bitline nodes of said memory array portion and connecting said local wordline to said high voltage node.

2. The circuit for selectively erasing a portion of a memory array as set forth in claim 1, wherein said logic portion is operable in association with a memory clear signal and its complement, said complement signal activating a pull-up transistor coupled between said high voltage node and said local wordline.

3. The circuit for selectively erasing a portion of a memory array as set forth in claim 1, wherein said logic portion is operable in association with a plurality of memory clear signals and their complements, each of said complement signals activating a pull-up transistor coupled between said high voltage node and a corresponding local wordline.

4. The circuit for selectively erasing a portion of a memory array as set forth in claim 1, wherein said memory array portion comprises a plurality of static random access memory (SRAM) cells.

5. The circuit for selectively erasing a portion of a memory array as set forth in claim 4, wherein each SRAM cell comprises six transistors.

6. The circuit for selectively erasing a portion of a memory array as set forth in claim 4, wherein each SRAM cell comprises a predetermined number of transistors.

7. The circuit for selectively erasing a portion of a memory array as set forth in claim 1, wherein said memory array portion comprises a plurality of dynamic random access memory (DRAM) cells.

8. The circuit for selectively erasing a portion of a memory array as set forth in claim 1, further including a switch for disabling a $V_{DD}$ node associated with said memory array portion.

9. A memory compiler for use in designing an integrated semiconductor device having an embedded memory instance, comprising:
  a memory macro cell associated with said embedded memory instance, said memory macro cell including an array core with a row decoder for generating global wordlines; and
  at least one memory array input/output (I/O) block having a tilable circuit associated therewith to selectively erase memory bit cells therein, said tilable circuit operating to alternatively couple said memory cells in said at least one memory array I/O block to corresponding global wordlines generated by said row decoder during a normal memory operation and to a high voltage node in an erase operation.

10. The memory compiler as set forth in claim 9, wherein said tilable circuit includes a plurality of pass gates, each of which is disposed between one of said global wordlines generated from said row decoder and a corresponding local wordline disposed in said memory array I/O block.

11. The memory compiler as set forth in claim 10, wherein said pass gates are actuated by at least one erase signal and its complement.

12. The memory compiler as set forth in claim 9, wherein said array core comprises a SRAM core.

13. The memory compiler as set forth in claim 9, wherein said array core comprises a DRAM core.

14. The memory compiler as set forth in claim 9, wherein said tilable circuit comprises a switch to disable a $V_{DD}$ node associated with said memory bit cells in said I/O block.

15. A circuit for selectively clearing an I/O block in a memory array, comprising:
  a plurality of pass gates disposed between global wordlines generated by a row decoder associated with said memory array and local wordlines provided in said I/O block in said memory array; and
  means for alternatively coupling said local wordlines to said global wordlines in a normal memory operation and to a high voltage node in an erase operation, whereby said I/O block is erased when a predetermined logic state is applied at bitline nodes of said I/O block and said local wordlines are coupled to said high voltage node.

16. The circuit as set forth in claim 15, further comprising means to disable a $V_{DD}$ node associated with said I/O block.

17. The circuit as set forth in claim 15, wherein said means for alternatively coupling is activated by a plurality of clear signals, each for erasing said I/O block in a staggered proportion.

18. The circuit as set forth in claim 15, wherein said means for alternatively coupling is activated by a plurality of clear signals, each for erasing a portion of said I/O block in nonlinear increments.

* * * * *